United States Patent
Hirai et al.

(10) Patent No.: US 8,958,215 B2
(45) Date of Patent: Feb. 17, 2015

(54) CIRCUIT BOARD FOR PERIPHERAL CIRCUITS OF HIGH-CAPACITY MODULES, AND A HIGH-CAPACITY MODULE INCLUDING A PERIPHERAL CIRCUIT USING THE CIRCUIT BOARD

(71) Applicant: NGK Insulators, Ltd., Nagoya (JP)

(72) Inventors: Takami Hirai, Toyota (JP); Shinsuke Yano, Nagoya (JP); Tsutomu Nanataki, Toyoake (JP); Hirofumi Yamaguchi, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 14/070,840

(22) Filed: Nov. 4, 2013

(65) Prior Publication Data
US 2014/0055973 A1   Feb. 27, 2014

Related U.S. Application Data

(63) Continuation of application No. PCT/JP2012/059754, filed on Apr. 10, 2012.

(30) Foreign Application Priority Data

May 16, 2011  (JP) .................................. 2011-109746
Nov. 22, 2011  (JP) .................................. 2011-255011

(51) Int. Cl.
*H05K 1/11* (2006.01)
*H05K 1/14* (2006.01)
(Continued)

(52) U.S. Cl.
CPC ............ *H05K 1/0306* (2013.01); *H01L 23/642* (2013.01); *H01L 25/162* (2013.01);
(Continued)

(58) Field of Classification Search
CPC ...... H05K 1/0306; H05K 1/18; H01L 23/057; H01L 23/13; H01L 23/24; H01L 23/36; H01L 23/49827; H01L 23/07
USPC .......................................... 361/803, 748, 784
See application file for complete search history.

(56) References Cited

U.S. PATENT DOCUMENTS

2005/0288167 A1   12/2005   Miyauchi et al.
2008/0305582 A1*  12/2008   Fillion et al. .................. 438/118
(Continued)

FOREIGN PATENT DOCUMENTS

JP   2003-017658 A1   1/2003
JP   3410696 B2        5/2003
(Continued)

OTHER PUBLICATIONS

International Search Report and Written Opinion dated Jul. 24, 2012.
(Continued)

*Primary Examiner* — Tuan T Dinh
*Assistant Examiner* — Ahmad D Barnes
(74) *Attorney, Agent, or Firm* — Burr & Brown, PLLC

(57) ABSTRACT

The present invention has an objective to provide a circuit board for a peripheral circuit which can transmit outside heat which generates from a high exothermic element, such as a power semiconductor element, while attaining reduction in size and weight, reduction in surge, and reduction in a loss, in high-capacity modules including power modules, such as an inverter.
[Solution Means] In a high-capacity module, by laminating a peripheral circuit using a ceramic circuit board with electrode(s) constituted by thick conductor and embedded therein on a highly exothermic element, overheating of the module is prevented by effective heat dissipation via the circuit board while attaining reduction in size and weight, reduction in surge, and reduction in a loss in the module.

12 Claims, 3 Drawing Sheets

(51) Int. Cl.
*H05K 1/00* (2006.01)
*H05K 1/18* (2006.01)
*H05K 7/00* (2006.01)
*H05K 1/03* (2006.01)
*H01L 23/64* (2006.01)
*H01L 25/16* (2006.01)
*H01L 23/50* (2006.01)
*H01L 23/367* (2006.01)
*H01L 23/373* (2006.01)
*H01L 23/498* (2006.01)
*H01L 23/00* (2006.01)

(52) U.S. Cl.
CPC ....... *H05K 1/18* (2013.01); *H01L 2224/48137* (2013.01); *H01L 2224/4903* (2013.01); *H01L 2924/19107* (2013.01); *H01L 23/50* (2013.01); *H01L 2924/13091* (2013.01); *H01L 23/3677* (2013.01); *H01L 2224/45124* (2013.01); *H01L 2924/13055* (2013.01); *H01L 2924/10253* (2013.01); *H01L 2924/30107* (2013.01); *H01L 23/3735* (2013.01); *H01L 23/49822* (2013.01); *H01L 24/45* (2013.01)

USPC ............ 361/803; 361/748; 361/784; 174/258

(56) References Cited

U.S. PATENT DOCUMENTS

2010/0246135 A1    9/2010  Hongo et al.
2012/0129299 A1*   5/2012  Lin et al. .................. 438/118

FOREIGN PATENT DOCUMENTS

| JP | 2004-087927 A1 | 3/2004 |
| JP | 2004-172211 A1 | 6/2004 |
| JP | 2006-303006 A1 | 11/2006 |
| JP | 2011-023654 A1 | 2/2011 |
| WO | 2008/053956 A1 | 5/2008 |

OTHER PUBLICATIONS

Extended European Search Report (Application No. 12786346.2) dated Nov. 12, 2014.

* cited by examiner

CIRCUIT BOARD FOR PERIPHERAL CIRCUITS OF HIGH-CAPACITY MODULES, AND A HIGH-CAPACITY MODULE INCLUDING A PERIPHERAL CIRCUIT USING THE CIRCUIT BOARD

BACKGROUND OF ME INVENTION

1. Field of the Invention

The present invention relates to a circuit board for peripheral circuits of high-capacity modules. More particularly, the present invention relates to a circuit board for peripheral circuits to be laminated with a circuit containing a high exothermic element in high-capacity modules including power modules, such as an inverter used in a hybrid car or an electric vehicle, etc. Furthermore, the present invention also relates to a high-capacity module including a peripheral circuit which uses the circuit board.

2. Description of Related Art

Conventionally, in high-capacity (large electric power) modules including power modules, such as an inverter, a circuit containing a power semiconductor element, such as a switching element (for example, IGBT (Insulated Gate Bipolar Transistor)) (may be referred to as a "power circuit" henceforth) and a peripheral circuit which controls such a power semiconductor element (may be referred to as a "drive circuit" henceforth) are arranged planarly, and the area for arranging the wiring (wire) for connecting these circuits is required, and these have become a factor for preventing reduction in size and weight of a high-capacity module (for example, refer to FIG. 2).

In the present specification, a high-capacity module refers to a module handling a large electric power with a voltage of 200V or more or a current of 10 A or more. As a specific example of such a high-capacity module, for example, what is called a "power module" etc. can be exemplified.

Moreover, concerns that wiring length becomes longer due to the wiring for connecting various circuits which constitute high-capacity modules as mentioned above, the loss as the whole module becomes larger, and the surge voltage which generates on switching due to the equivalent inductance of the wire becomes larger have been recognized. Excessive surge voltage has a possibility of damaging, for example, a semiconductor element in a drive circuit, etc.

By the way, in recent years, for example, along with the popularization of hybrid vehicles and of electric vehicles etc., further improvement in performance such as reduction in size and weight, reduction in surge (surge control), and higher-efficiency (reduction in a loss), etc. has been increasingly demanded.

Then, approaches to laminate circuit boards for various circuits which constitute high-capacity modules as mentioned above in order to attain reduction in size and weight of the high-capacity modules and to improve the connection configuration between the various circuit boards which constitute the high-capacity modules in order to attain reduction in surge and reduction in a loss have been proposed (for example, refer to Patent documents 1 to 3).

However, when various circuit boards which constitute a high-capacity module are laminated as mentioned above, reduction in size and weight of the module can be attained, while it may become more difficult to transmit and release heat which generates from a power semiconductor element, such as a switching element and, therefore, there is a possibility that a problem, such as breakage of the module (for example, degradation of sealing resin of a circuit element which constitutes the module) etc. may occur.

In the present specification, a high exothermic element refers to an element whose temperature may reach 120° C. or higher in its operating state. As a specific example of such a high exothermic element, for example, a power semiconductor element etc. can be exemplified. Moreover, as a specific example of such a power semiconductor element, for example, a switching element etc. can be exemplified. Furthermore, as a specific example of such a switching element, for example, an IGBT as mentioned above, an SiC-MOSFET which will be mentioned later, etc. can be exemplified.

To problems as mentioned above, an approach to stick a leadframe to an undersurface of a circuit board of a drive circuit laminated on a power circuit containing a switching element and thereby release heat generated from the switching element in a direction toward an upper surface (upper direction) of a module through the leadframe while reducing a switching loss and switching surge has been also proposed (for example, refer to Patent Literature 1 (PTL 1)). However, in such a configuration, since the pathway to the upper direction of the heat generating from the switching element is limited to the leadframe, there is a possibility that the heat dissipation effect may become insufficient.

Moreover, when a resin circuit board is used in a drive circuit laminated with a power circuit, there is a possibility that, due to heat generation from the power circuit, the resin circuit board may expand and/or deform and it may lead to decrease in reliability and/or lead to disconnection or destruction of the circuit at worst.

On the other hand, as a loss remedy of a power semiconductor element including IGBT, MOSFET, etc., it has been proposed to use a silicon carbide (SiC) wafer in place of a silicon (Si) wafer which has been used conventionally. This SiC wafer has a feature that an operation at higher temperature is possible, as compared with a conventional Si wafer. Thereby, a cooling mechanism (for example, a heat sink, a water-cooling mechanism, etc.) which has been indispensable in a power module which uses a conventional Si wafer can be drastically simplified. As a result, reduction in size and weight of a power module can be also attained by using a SiC wafer. However, there is a tendency that various problems due to heat generation from a high exothermic element as mentioned above become still severer by a rise of an operation temperature of the power module accompanying use of a SiC wafer.

Moreover, since thickness of a conductor used in a peripheral circuit is thin, there is also a subject that the loss at the time of passing current is large.

CITATION LIST

Patent Literature

[PTL 1] Japanese Patent Application Laid-Open (kokai) No. 2006-303006
[PTL 2] Japanese Patent No. 3410696
[PTL 3] Japanese Patent Application Laid-Open (kokai) No. 2011-23654

SUMMARY OF THE INVENTION

Technical Problem

As mentioned above, along with progress of reduction in size and weight and a rise of an operation temperature in high-capacity modules including power modules, such as an inverter, problems, such as breakage of the module etc. (for example, degradation of sealing resin of a circuit element which constitutes the module, expansion and deformation of a resin circuit board of a peripheral circuit) due to an excessive rise in temperature resulting from heat which generates from a high exothermic element, such as a power semiconductor element, tend to become increasingly severe.

Therefore, in a high-capacity module which is intended to attain reduction in size and weight, reduction in surge, and reduction in a loss, by lamination of various composition circuit boards, a technology, which can more efficiently transmit heat which generates from a high exothermic element outside to reduce problems, such as breakage of the module etc. (for example, degradation of sealing resin of a circuit element which constitutes the module, and/or expansion and/or deformation of a resin circuit board of a peripheral circuit) due to an excessive rise in temperature while attaining reduction in size and weight, reduction in surge, and reduction in a loss, has been sought.

The present invention has been conceived in order to meet such a demand. More specifically, the present invention has an objective to provide a highly reliable circuit board for a peripheral circuit which can transmit heat which generates from a high exothermic element, such as a power semiconductor element, while attaining reduction in size and weight, reduction in surge, and reduction in a loss, in high-capacity modules including power modules, such as an inverter.

Solution to Problem

The above-mentioned objective can be attained by, a circuit board which is used for a second electronic circuit laminated on the side of a first electronic circuit containing a high exothermic element, on which said high exothermic element is disposed, via said high exothermic element, characterized in that:

said circuit board comprises a substrate, which comprises dielectric layer(s) mainly comprising ceramics, and first surface electrode(s), which is formed on the side of said circuit board, facing said first electronic circuit, at least a part of conductor, which constitutes said first surface electrode(s), is embedded inside of said substrate, said conductor, which constitutes said first surface electrode(s), is exposed out of said substrate at least in a region of a first surface which is the surface of said circuit board, facing said first electronic circuit, and said region is opposed to terminal(s) of said high exothermic element, and the thickness of said conductor, which constitutes said first surface electrode(s), is not less than 100 micrometers in a direction perpendicular to said first surface.

Advantageous Effects of Invention

As mentioned above, a circuit board according to the present invention can be used in a (second) electronic circuit (for example, a peripheral circuit, such as a drive circuit) which is laminated with a (first) electronic circuit (for example, a power circuit) containing a high exothermic element, for example, for the purpose of reduction in size and weight of a high-capacity module including a power module, such as an inverter, etc.

A circuit board according to the present invention has a configuration in which a first surface electrode formed on the side facing a first electronic circuit is disposed in a substrate comprising dielectric layer(s) which mainly comprises ceramics. Thereby, when a second electronic circuit including the circuit board is laminated on the side, on which a high exothermic element of the first electronic circuit containing the high exothermic element is disposed, of the first electronic circuit, via the high exothermic element, it becomes possible to release heat which generates from the high exothermic element not only via the circuit board of the first electronic circuit, but also via the circuit board of the second electronic circuit, and therefore heat release of the whole module containing these electronic circuits can be effectively performed to suppress excessive rise in temperature of the module.

Moreover, since ceramics has a smaller thermal expansion coefficient as compared with resin widely used as a substrate of resin circuit boards according to conventional technologies, stress resulting from heat generation from a high exothermic element (for example, a power semiconductor element, etc.) as mentioned above due to difference of thermal expansion coefficients of circuit boards between a peripheral circuit (drive circuit) and a power circuit.

In addition to the above, in the circuit board according to the present invention, at least a part of conductor which constitutes the first surface electrode is embedded inside of the substrate. Thereby, a highly reliable high-capacity module can be achieved, since stress acting on an interface between the substrate and the conductor (such as, for example, stress which generates due to difference between thermal expansion coefficients of the substrate and the conductor which constitutes the first surface electrode(s) and/or stress which generates due to difference between thermal expansion coefficients of the circuit board according to the present invention and the high exothermic element and/or the circuit board of the first electronic circuit, etc.) can be reduced.

Furthermore, in the circuit board according to the present invention, the conductor, which constitutes the first surface electrode(s), is exposed out of the substrate at least in a region of a first surface which is the surface of said circuit board, facing said first electronic circuit, and said region is opposed to a terminal(s) of said high exothermic element. Thereby, the second electronic circuit including the circuit board according to the present invention and the high exothermic element can be connected in a shorter distance, for example, to suppress surge voltage at the time of switching (reduction in surge).

Still furthermore, in the circuit board according to the present invention, the thickness of the conductor, which constitutes the first surface electrode(s), is not less than 100 micrometers (in a direction perpendicular to the first surface). Thereby, the loss as the whole module including the electronic circuit which uses the circuit board according to the present invention can be reduced.

As mentioned above, the present invention can provide a highly reliable circuit board for a peripheral circuit which can more efficiently transmit heat generating from a high exothermic element, such as a power semiconductor element, outside while attaining reduction in size and weight, reduction in surge, and reduction in a loss, in high-capacity modules including power modules, such as an inverter.

DETAILED DESCRIPTION OF THE INVENTION

Figure 1:
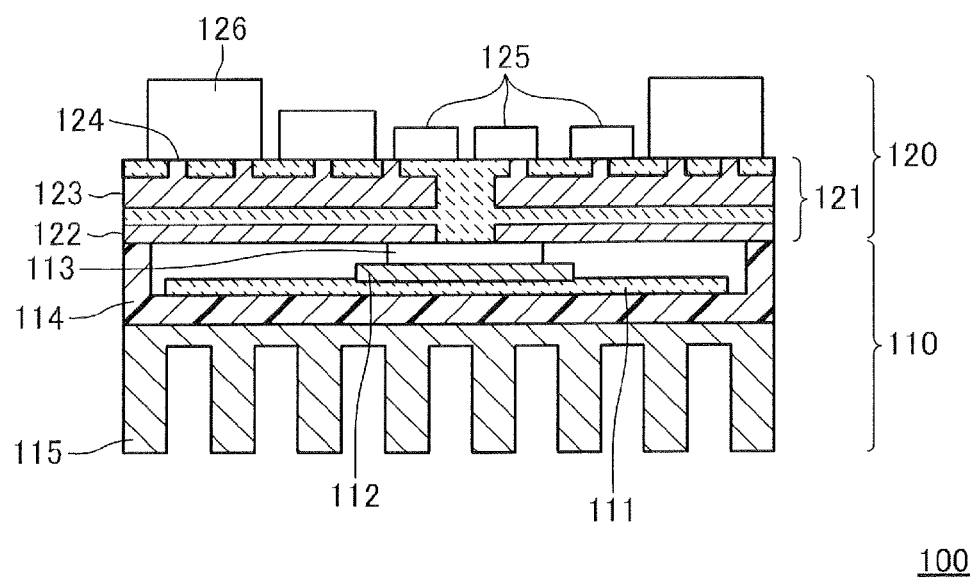
FIG. 1 A schematic view showing the configurations of a circuit board according to one embodiment of the present invention and a module containing the circuit board.

As mentioned above, the present invention has an objective to provide a highly reliable circuit board for a peripheral circuit which can transmit heat which generates from a high exothermic element, such as a power semiconductor element, outside while attaining reduction in size and weight, reduction in surge, and reduction in a loss, in high-capacity modules including power modules, such as an inverter.

As a result of wholehearted research for achieving the above-mentioned objective, the inventors have conceived that, in high-capacity modules including power modules, such as an inverter, by laminating a peripheral circuit using a ceramics circuit board within which an electrode constituted by thick conductor is embedded on an exothermic element, overheating of the module can be suppressed due to more effective heat release via the circuit board while attaining reduction in size and weight, reduction in surge, and reduction in a loss of the module.

Namely, the first embodiment of the present invention is;

A circuit board which is used for a second electronic circuit laminated on the side of a first electronic circuit containing a high exothermic element, on which said high exothermic element is disposed, via said high exothermic element, characterized in that:

said circuit board comprises a substrate, which comprises dielectric layer(s) mainly comprising ceramics, and first surface electrode(s), which is formed on the side of said circuit board, facing said first electronic circuit, at least a part of conductor, which constitutes said first surface electrode(s), is embedded inside of said substrate, said conductor, which constitutes said first surface electrode(s), is exposed out of said substrate at least in a region of a first surface which is the surface of said circuit board, facing said first electronic circuit, and said region is opposed to terminal(s) of said high exothermic element, and the thickness of said conductor, which constitutes said first surface electrode(s), is not less than 100 micrometers in a direction perpendicular to said first surface.

As mentioned above, the circuit board according to the present embodiment as a circuit board constituting a peripheral circuit (second electronic circuit) such as a drive circuit is laminated on the side, on which a high exothermic element such as a power semiconductor element is disposed, of an electronic circuit (first electronic circuit) containing the high exothermic element via the high exothermic element, to contribute to reduction in size and weight of high-capacity (large electric power) modules including power modules, such as an inverter, In addition, as mentioned above, the above-mentioned high-capacity (large electric power) modules may be power modules, such as an inverter, or may be other high-capacity modules handling large electric power. Moreover, although power semiconductor elements, such as a switching element, can be exemplified as the above-mentioned high exothermic element when the above-mentioned high-capacity (large electric power) modules are power modules, such as an inverter, as mentioned above, the high exothermic element in the present embodiment is not limited to a switching element, and it may be any element which emits large quantities of heat in a high-capacity (large electric power) module. Furthermore, although an IGBT, an SiC-MOSFET, etc. can be exemplified as a switching element when the above-mentioned high exothermic element is a switching element, a switching element in the present embodiment is not limited to an IGBT and an SiC-MOSFET, and it may be any switching element known in the art.

By the way, as mentioned previously, in a conventional technology, when various circuit boards constituting a high-capacity module are laminated as mentioned above, although the module can attain reduction in size and weight, It becomes more difficult to transmit and release outside heat generating from a power semiconductor element such as a switching element, and there is a possibility that problems such as breakage of the module (for example, degradation of sealing resin of the circuit element constituting the module) etc. by excessive rise in temperature due to heat generation from these high exothermic elements.

Then, in a conventional technology, as a countermeasure against the problems as mentioned above, for example, an attempt to transfer heat generating from a switching element via a leadframe to an upper direction of the module (direction from the first electronic circuit to the second electronic circuit) by pasting a leadframe on the undersurface of the circuit board of a drive circuit (corresponding to the second electronic circuit) laminated on a power circuit (corresponding to the first electronic circuit) containing a switching element has been also proposed (for example, refer to Patent Literature 1 (PTL 1)). However, in such a configuration, since the pathway to the upper direction of the heat generating from the switching element is limited to the leadframe, there is a possibility that the heat dissipation effect may become insufficient. Moreover, since circuit boards for peripheral circuits according to a conventional technology are made of resin in many cases and its thermal conductivity is low, sufficient heat dissipation through the circuit board of a peripheral circuit cannot be expectable.

On the other hand, as mentioned above, the circuit board according to the present embodiment has a configuration in which the first surface electrode(s) formed on the side of the first electronic circuit is disposed in the substrate comprising dielectric layer(s) which mainly comprises ceramics. Thereby, in a module where the circuit board according to the present embodiment as a circuit board of a second electronic circuit is laminated on the side of the high exothermic element of the first electronic circuit through the high exothermic element, it becomes possible to release heat which generates from the high exothermic element not only via the circuit board of the first electronic circuit, but also via the circuit board according to the present embodiment, which has higher thermal conductivity as compared with the circuit board of a peripheral circuit according to a conventional technology, to the side of the second electronic circuit, and thus heat in the whole module including these electronic circuits can be effectively released, and thereby excessive rise in temperature of the module can be suppressed.

In addition, as mentioned above, at least a part of the conductor, which constitutes the first surface electrode(s), is embedded inside of the substrate of the circuit board of the second electronic circuit. Therefore, a state where at least a part of the conductor, which constitutes the first surface electrode(s), is embedded inside of the substrate and the other parts protrude from the first surface, which is the surface of the circuit board of the second electronic circuit, facing the first electronic circuit can be assumed. In such a state, a case where the substrate of the circuit board of the second electronic circuit does not contact the high exothermic element and only the conductor which constitutes the first surface electrode(s) contacts the high exothermic element on the first electronic circuit may happen. However, even in such a case, heat which generates from the high exothermic element is transmitted to the substrate of the circuit board of the second electronic circuit via the protruded first surface electrode(s). In addition, since the substrate of the circuit board according to the present embodiment comprises dielectric layer(s) mainly comprising ceramics, as mentioned above, it has higher thermal conductivity as compared with the circuit board of the peripheral circuit according to a conventional technology. As a result, even in such a case, the circuit board according to the present embodiment can release heat more effectively as compared with the circuit board of the peripheral circuit according to a conventional technology.

On the other hand, a state where the whole conductor, which constitutes the first surface electrode(s), is embedded inside of the substrate and only the surface of the conductor is exposed in the same plane as the first surface of the circuit board can be also assumed. In such a state, both of the surface of the substrate of the second electronic circuit and the surface of the conductor which constitutes the first surface electrode(s) can be simultaneously contacted with the high exothermic element. In this case, heat which generates from the high exothermic element is transmitted, from a portion which directly contacts the conductor of the first surface electrode(s) (for example, a terminal portion of the high exothermic element concerned, etc.) to the conductor, and from a portion which contacts the substrate of the circuit board of the second electronic circuit to the substrate, respectively.

In the point that heat thus transmitted to the circuit board according to the present embodiment is released via the circuit board thereafter, the above state is the same as the state where the conductor which constitutes the first surface electrode(s) protrudes from the first surface. However, in the state where only the surface of the conductor which constitutes the first surface electrode(s) is exposed in the same plane as the first surface, as mentioned above, since the contact area between the high exothermic element and the circuit board of the second electronic circuit becomes large, heat can be released much more effectively.

In addition, as a modification of the present embodiment, unless it becomes a substantial hindrance of reduction in the size and weight, reduction in surge, and reduction in a loss in a high-capacity module, an electrical connection with the high exothermic element may be achieved through a leadframe etc. pasted to the first surface electrode(s).

By the way, as mentioned above, the circuit board according to the present embodiment has a configuration wherein first surface electrode(s) formed on the side of the first electronic circuit in the substrate which comprises dielectric layer(s) mainly comprising ceramics. As compared with resin generally used as a substrate of resin circuit boards according to a conventional technology, in general, the thermal expansion coefficient of ceramics is smaller. Thereby, when the circuit board according to the present embodiment is used, for example, stress which generates due to the difference in the thermal expansion coefficient of a circuit board between a peripheral circuit (drive circuit) and a power circuit by heat generation from a high exothermic element (for example, a power semiconductor element) etc. can be made smaller as compared with the case where a resin circuit board according to a conventional technology is used.

In addition to the above, in the circuit board according to the present embodiment, at least a part of the conductor, which constitutes the first surface electrode(s), is embedded inside of the substrate, as mentioned above. Thereby, stress which acts on the interface between the conductor and the substrate, such as stress which generates due to the difference in thermal expansion coefficient between the conductor constituting the electrode and the substrate, etc. can be reduced, and therefore a highly reliable high-capacity module can be achieved.

More particularly, for example, when a leadframe and/or a conductive pattern are pasted on the surface of a circuit board like a circuit board for a peripheral circuit according to a conventional technology, there is a possibility that stress which generates due to the difference in thermal expansion coefficient of circuit board between the peripheral circuit (drive circuit) and a power circuit by heat generation from a high exothermic element as mentioned above (for example, a power semiconductor element, etc.) may concentrate, for example, on the interface between an electrode and (the substrate of) the circuit board to separate the leadframe and/or a conductive pattern from the surface of the circuit board and lead to decrease in reliability of the whole module including the circuit or lead to disconnection and destruction of the circuit at worst.

In contrast to this, in the circuit board according to the present embodiment, at least a part of the conductor, which constitutes first surface electrode(s) is embedded inside of the substrate. Thereby, since the surroundings of a point on which stress as mentioned above concentrates are covered with the substrate of the circuit board and thereby the stress concerned is relaxed and distributed, unlike the case where a leadframe and/or a conductive pattern are pasted on the surface of a circuit board, for example, problems as mentioned above are unlikely to occur, and reliability as the whole module including an electronic circuit which uses the circuit board can be further improved.

Furthermore, in the circuit board according to the present embodiment, the conductor, which constitutes first surface electrode(s), is exposed out of the substrate at least in a region of a first surface which is the surface of the circuit board, facing the first electronic circuit, and the region is opposed to a terminal(s) of the high exothermic element. Thereby, the second electronic circuit containing the circuit board according to the present embodiment and the high exothermic element can be connected in the shortest distance and therefore, for example, surge voltage at the time of switching can be suppressed (reduction in surge).

More particularly, in the circuit board according to the present embodiment, as mentioned above, the conductor, which constitutes the first surface electrode(s), is exposed out of the substrate so that it may protrude from the first surface, which is the surface on the side of the circuit board, facing the first electronic circuit, or so that it is exposed in the same plane as the first surface. The conductor which constitutes the first surface electrode(s) electrically connects the second electronic circuit containing the circuit board according to the present embodiment with the high exothermic element. Namely, the conductor is exposed out of the substrate of the circuit board, at least in a region of the first surface of the circuit board according to the present embodiment, which is opposed to a terminal(s) of the high exothermic element. Thereby, the second electronic circuit containing the circuit board according to the present embodiment can be directly connected with the high exothermic element.

Therefore, in accordance with the present embodiment, the second electronic circuit and the high exothermic element can be connected in a shorter distance, as compared with the case where a peripheral circuit according to a conventional technology. As a result, inductance between the first electronic circuit (for example, power circuit) containing the high exothermic element (for example, power semiconductor elements, such as a switching element) and the second circuit (for example, peripheral circuit, such as a drive circuit) containing the circuit board according to the present embodiment can be made smaller, and thereby, in a module (for example, a power module etc.) including these circuits, for example, surge voltage at the time of switching can be suppressed (reduction in surge).

In addition, although the electrical connection between the conductor which constitutes the first electrode(s) exposed out of the substrate of the circuit board according to the present embodiment and the terminal of the high exothermic element can be achieved, for example, by soldering, the connection methods are not limited to a specific technique, and the electrical connection between the conductor which constitutes the first electrode(s) and the terminal of the high exothermic element may be achieved by using any of the techniques known in the art.

Furthermore, in the circuit board according to the present embodiment, the thickness of the conductor, which constitutes the first surface electrode(s), is not less than 100 micrometers, more preferably not less than 200 micrometers (in a direction perpendicular to the first surface). Thereby, the loss as the whole module including an electronic circuit which uses the circuit board according to the present embodiment can be decreased.

As mentioned above, the first surface electrode(s) in the circuit board according to the present embodiment electrically connects the second electronic circuit (for example, a peripheral circuit, such as a drive circuit) containing the circuit board according to the present embodiment with the high exothermic element (for example, power semiconductor elements, such as a switching element) contained in the first electronic circuit (for example, power circuit). Therefore, since it is assumed that large current flows through the first surface electrode(s), in order to make the loss in the first surface electrode(s) smaller, it is desirable to enlarge the connection area between the high exothermic element and the first surface electrode(s). Similarly, it is also desirable to enlarge the thickness of the conductor which constitutes the first surface electrode(s).

As mentioned above, in accordance with the present embodiment, a highly reliable circuit board for a peripheral circuit which can more efficiently transmit heat generating from a high exothermic element, such as a power semiconductor element, outside while attaining reduction in size and weight, reduction in surge, and reduction in a loss, in high-capacity modules including power modules, such as an inverter can be provided.

By the way, as long as the above-mentioned requirements are satisfied, a method for manufacturing the circuit board according to the present embodiment may be any kind of method, and can be suitably chosen from various methods used for manufacturing ceramics circuit boards in the art. As a specific example of the method for manufacturing the circuit board according to the present embodiment, for example, what is called a "gel-cast method", a "doctor blade method", etc. can be exemplified.

When the above-described gel-cast method is adopted, a circuit board according to the present embodiment can be obtained, for example, by disposing a conductive pattern on the surface of a film-like or sheet-like protective backing material by a printing method, such as a screen printing method, etc., injecting a slurry of a dielectric material, such as ceramics, into the portion in which the conductive pattern has not been disposed, laminating required number of sheets of a dielectric material with the conductive pattern embedded therein, which is obtained by solidifying the slurry to constitute the conductive pattern as surface electrode(s), and sintering the same.

As the above-mentioned protective backing material, it is desirable to use resin films, such as a polyethylene terephthalate (PET) film, a polyethylene naphthalate (PEN) film and, besides resin films, various film-like or sheet-like materials, such as a glass board, paper, or metal, can be used. However, as protective backing material, it is preferable to use those with flexibility from a viewpoint of the ease of peel-off operation.

Moreover, for example, for the objective of enabling it to easily peel off the sheet of the dielectric material from the protective backing material, etc., for example, a release agent etc. may be applied to the surface of the above-mentioned protective backing material. Such a release agent includes, for example, various agents known as mold lubricant in the art. More specifically, as such a release agent, well-known silicone series release agents, fluorine series release agents, and etc. can be used.

It is desirable that the above-mentioned conductive pattern is disposed by forming a conductive paste, which comprises, as main components, at least one or more kinds of metal chosen from, for example, gold (Au), silver (Ag), and copper (Cu), etc. and a thermosetting resin precursor, on the surface of the above-mentioned protective backing material, by a method, such as a screen printing, etc. As such thermosetting resin precursors, phenol resin, resole resin, urethane resin, epoxy resin, melamine resin, etc. can be used. Among these, phenol resin and resole resin are especially preferable. After printing such a conductive paste on the surface of the above-mentioned protective backing material, a conductive pattern can be obtained by hardening the binder contained in the conductive paste.

As slurry of the above-mentioned dielectric material, for example, slurry which comprises resin, ceramics powder, and a solvent can be exemplified. In this case, resin can function as what is called a "binder" and, for example, thermosetting resin, such as phenol resin, resole resin, or polyurethane resin, or a polyurethane precursor which comprises polyol and polyisocyanate can be used. Among these, a thermosetting resin precursor which comprises polyol and polyisocyanate is especially preferable.

As a ceramics material used as ceramics powder, any of oxide series ceramics or non-oxide series ceramics can be used. For example, alumina ($Al_2O_3$), zirconia ($ZrO_2$), barium titanate ($BaTiO_3$), silicon nitride ($Si_3N_4$), silicon carbide (SiC), barium oxide (BaO), titanium oxide ($TiO_2$), oxidized silicon ($SiO_2$), zinc oxide ($ZnO_2$), neodymium oxide ($Nd_2O_3$), etc. can be used. Moreover, these materials may be used solely or in combination of two or more kinds thereof. Furthermore, as long as a slurry can be prepared, particle size of ceramics material is not particularly limited.

Moreover, the above-mentioned solvent is not particularly limited, as long as it can dissolve resin as the above-mentioned binder (and a dispersing agent, when used). As a specific example of the solvent, a solvent which has two or more ester bonds, such as polybasic acid ester (for example, dimethyl glutarate, etc.) and acid ester of polyhydric alcohol (for example, triacetin (glyceryl triacetate) etc.), etc, can be exemplified.

Furthermore, slurry of the above-mentioned dielectric material may contain a dispersing agent in addition to the above-mentioned resin, ceramics powder, and solvent. As a specific example of a dispersing agent, for example, polycarboxylic acid series copolymers, polycarboxylic acid salts, etc. can be exemplified. By adding such a dispersing agent, a slurry before molding can have low viscosity and high flowability.

By the way, various current, such as a signal for controlling operation of a high exothermic element, an input current to a high exothermic element, or output current from a high exothermic element, for example, may flow through various circuit element(s) and terminal(s) which constitute the second electronic circuit containing the circuit board according to the present invention. These current flows via the above-mentioned first surface electrode(s) between various circuit element(s), terminal(s), etc, which constitute the second electronic circuit, and a high exothermic element. However, it is common that various circuit element(s) and terminal(s), etc. which constitute the second electronic circuit are disposed on the surface opposite to the first surface electrode(s) of the circuit board according to the present invention. Therefore, a circuit which electrically connects the first surface electrode(s) with various circuit element(s), terminal(s), etc. disposed on the surface of the opposite side of the circuit board is required.

Such an electrical connection can be achieved by at least one layer of inner layer electrode(s) embedded inside of the circuit board according to the present invention. Since an electrical connection through such an inner layer electrode(s) between the first surface electrode(s) and various circuit elements, terminal, etc. which are disposed on the surface on the side opposite to the circuit board can be made shorter as compared with a connection method according to a conventional technology, for example, such as wire bonding, and therefore can reduce the loss as the whole module including the electronic circuit which uses the circuit board according to the present invention, it is desirable.

Therefore, the second embodiment of the present invention is;

a circuit board which is used for a second electronic circuit laminated on the side of a first electronic circuit containing a high exothermic element, on which said high exothermic element is disposed, via said high exothermic element, characterized in that:

said circuit board comprises a substrate, which comprises dielectric layer(s) mainly comprising ceramics, and first surface electrode(s), which is formed on the side of said circuit board, facing said first electronic circuit, and at least one layer of inner layer electrode(s), which is embedded inside of inner layer(s) of said circuit board, at least a part of conductor, which constitutes said first surface electrode(s), is embedded inside of said substrate, said conductor, which constitutes said first surface electrode(s), is exposed out of said substrate at least in a region of a first surface which is the surface of said circuit board, facing said first electronic circuit, and said region is opposed to terminal(s) of said high exothermic element, and the thicknesses of said conductor, which constitutes said first surface electrode(s), and conductor, which constitutes at least one layer of said inner layer electrode(s), are not less than 100 micrometers in a direction perpendicular to said first surface.

The circuit board according to the present embodiment has the same configuration as the circuit board according to said first embodiment of the present invention, except for that the circuit board further comprises at least one layer of the inner layer electrode(s) embedded inside of an inner layer of the circuit board and the thickness of the conductor which constitutes at least one layer of the inner layer electrode(s) in a direction which intersects perpendicularly with the first surface is not less than 100 micrometers. In the present embodiment, as mentioned above, not only the conductor which constitutes the first surface electrode(s), but also the conductor which constitutes at least one layer of the inner layer electrode(s) have thicknesses of not less than 100 micrometers, more preferably not less than 200 micrometers (in a direction which intersects perpendicularly with the first surface). Thereby, in the circuit board according to the present embodiment, the loss in the electrical connection between various circuit element(s), terminal(s), etc. which constitute the second electronic circuit, and the high exothermic element can be also made smaller, and as a result the loss as the whole module including the electronic circuit which uses the circuit board according to the present embodiment can be made small.

By the way, as mentioned above, in the circuit board according to the present embodiment, the thicknesses of the conductor, which constitutes the first surface electrode(s), and the conductor, which constitutes at least one layer of the inner layer electrode(s), (in a direction perpendicular to the first surface) are not less than 100 micrometers, more preferably not less than 200 micrometers. Thereby, the loss as the whole module including the electronic circuit which uses the circuit board according to the present embodiment can be made small.

Moreover, as mentioned above, the first surface electrode(s) in the circuit board according to the present embodiment electrically connects the second electronic circuit (for example, a peripheral circuit, such as a drive circuit) containing the circuit board according to the present embodiment with the high exothermic element (for example, power semiconductor elements, such as a switching element) contained in the first electronic circuit (for example, power circuit). Therefore, since it is assumed that large current flows through the first surface electrode(s), in order to make the loss in the first surface electrode(s) smaller, it is desirable to enlarge the connection area between the high exothermic element and the first surface electrode(s). As a result, the total area which the first surface electrode(s) occupies in the first surface of the circuit board according to the present embodiment becomes larger.

On the other hand, at the surface on the side opposite to the first surface of the circuit board according to the present embodiment (the second surface), electrode(s) for mounting various circuit elements, which constitute the second electronic circuit containing the circuit board according to the present embodiment, and/or terminals, etc. (the second surface electrode(s)) (for example, land etc.) is disposed in many cases. The second electronic circuit constitutes a peripheral circuit, such as a drive circuit, etc., as mentioned above. Therefore, unlike the first surface electrode(s) for achieving a (high-capacity) electrical connection with the high exothermic element, the second surface electrode(s) comes to achieve an electrical connection with a relatively low-capacity (low electric power) circuit elements which constitute a peripheral circuit, and therefore the total area which the second surface electrode(s) occupies in the second surface of the circuit board according to the present embodiment becomes relatively smaller and the thickness of the conductor which constitutes the second surface electrode(s) (in a direction which intersects perpendicularly with the first surface) also becomes relatively thinner.

As mentioned above, in the circuit board according to the present embodiment, the total area which the first surface electrode(s) occupies in the first surface facing the first electronic circuit containing the high exothermic element is relatively large, and the thickness of the first surface electrode(s) is also relatively thick. On the other hand, the total area which the second surface electrode(s) occupies in the second surface on the side opposite to the first surface, on which various circuit elements constituting the second electronic circuit and/or terminals, etc. are mounted, is relatively small, and the thickness of the second surface electrode(s) is also relatively thin. As mentioned above, the material which constitutes these electrodes comprises metal as a major component and has a larger thermal expansion coefficient as compared with the dielectric material comprising ceramics as a major component, which is the substrate of the circuit board according to the present embodiment. Namely, the total area which the electrode(s) having a larger thermal expansion coefficient occupies and the thickness thereof are relatively large on the first surface side of the circuit board according to the present embodiment, while the total area which the electrode(s) having a larger thermal expansion coefficient occupies and the thickness thereof are relatively small on the second surface side of the circuit board according to the present embodiment.

Moreover, in general, the cross-sectional area by a plane parallel to the first surface of the conductor which constitutes at least one layer of the inner layer electrode(s) embedded inside the substrate of the circuit board according to the present embodiment is also smaller than the total area of the first surface electrode(s).

Therefore, for example, when the temperature of the circuit board according to the present embodiment rises due to heat generation from the high exothermic element in accordance with operation of the module which comprises the second electronic circuit containing the circuit board and the first electronic circuit containing the high exothermic element, the extent of thermal expansion resulting from the rise in temperature is different between the region in the vicinity of the first surface of the circuit board according to the present embodiment and other regions. More specifically, the extent of thermal expansion of the region in the vicinity of the first surface, where the total area and thickness occupied by the first surface electrode(s) are relatively large, becomes larger as compared with the extent of thermal expansion of other regions (where the total area and thickness occupied by electrode(s) are relatively small).

Due to the difference in the extent of thermal expansion between the region in vicinity of the first surface and other regions, the circuit board according to the present embodiment may be curved when the temperature of the circuit board according to the present embodiment remarkably changes. For example, in the cooling process after manufacturing the circuit board according to the present embodiment by sintering as mentioned above, the extent of contraction of the region in vicinity of the first surface of the circuit board accompanying the temperature fall is relatively large, and the extent of contraction of other regions of the circuit board is relatively small. Consequently, even if the circuit board is not curved at the time of the completion of sintering, the circuit board may be curved so that the first surface side may become concave, as a result of the above-mentioned temperature fall.

Moreover, even if a circuit board without a curvature is obtained at the time of the completion of cooling (that is, at the time of the completion of manufacture of the circuit board), for example, by elaborating a countermeasure such as sintering in a state where the circuit board is curved beforehand so that the curvature accompanying cooling after sintering as mentioned above may be offset, for example, when the rise in temperature resulting from heat generation from the high exothermic element in accordance with operation of the module which comprises the second electronic circuit containing the circuit board according to the present embodiment and the first electronic circuit containing the high exothermic element is remarkable, the extent of expansion of the region in vicinity of the first surface of the circuit board accompanying the rise in temperature is relatively large, and the extent of expansion of other regions of the circuit board is relatively small. Consequently, even if the circuit board is not curved at the time of the completion of manufacture, the circuit board may be curved so that the first surface side may become convex as a result of the above-mentioned rise in temperature.

When the circuit board according to the present embodiment is curved as mentioned above, contact and junction between the circuit board according to the present embodiment and the high exothermic element are not fully secured and, as a result, there is a possibility that transmission to the circuit board of heat which generates from the high exothermic element may become insufficient, the electrical connection between the high exothermic element and the second electronic circuit may be shut off, and the electrical connection between the circuit elements which constitute the second electronic circuit may be shut off.

As mentioned above, in the circuit board according to the present embodiment, the volume occupied by the electrode(s) having a larger thermal expansion coefficient (as compared with the substrate of the circuit board) is relatively large in the region in vicinity of the first surface, while the volume occupied by the electrode(s) having a larger thermal expansion coefficient (as compared with the substrate of the circuit board) is relatively small in other regions. Therefore, it is thought that the above-mentioned curvature may occur due to the average thermal expansion coefficient of the region in vicinity of the first surface being larger than the average thermal expansion coefficient of other regions.

Therefore, in order to suppress generating of the curvature as mentioned above, it is thought desirable to make small the difference between the average thermal expansion coefficient of the region in vicinity of the first surface of the circuit board according to the present embodiment and the average thermal expansion coefficient of other regions. From such a viewpoint, as a result of wholehearted research, the inventors have found that the curvature of the circuit board, as mentioned above, can be suppressed by making the thickness of the conductor which constitutes at least one layer of the inner layer electrode(s) larger than the thickness of the conductor which constitutes the first surface electrode(s).

Namely, the third embodiment of the present invention is;
the circuit board according to said second embodiment of the present invention, characterized in that:
the thickness of said conductor, which constitutes at least one layer of said inner layer electrode(s), in a direction perpendicular to said first surface is larger than the thickness of said conductor, which constitutes said first surface electrode(s), in a direction perpendicular to said first surface.

In the circuit board according to the present embodiment, as mentioned above, the thickness (in a direction perpendicular to the first surface) of the conductor which constitutes at least one layer of the inner layer electrode(s) is larger than the thickness (in a direction perpendicular to the first surface) of the conductor which constitutes the first surface electrode(s). Thereby, as compared with the case where the thickness of the conductor which constitutes the inner layer electrode(s) is comparable to or smaller than the thickness of the conductor which constitutes the first surface electrode(s), the average thermal expansion coefficient of the region which contains the inner layer electrode and is not in vicinity of the first surface becomes larger. As a result, as compared with the case where the thickness of the conductor which constitutes the inner layer electrode(s) is comparable to or smaller than the thickness of the conductor which constitutes the first surface electrode(s), the difference of the average thermal expansion coefficient of the region in vicinity of the first surface and the thermal expansion coefficient of other regions becomes smaller.

In addition, the thickness of the conductor which constitutes at least one layer of the inner layer electrode(s) in the circuit board according to the present embodiment can be determined, for example, according to the total area and/or thickness of the conductor which constitutes the first surface electrode(s), the total area of the inner layer electrode(s) and/or the position at which the inner layer electrode(s) is embedded inside the circuit board, etc., so that the extent of curvature of the circuit board in a temperature range to which the circuit board is subjected in its intended use may be fall within an acceptable range in the use. Namely, the thickness of the conductor which constitutes at least one layer of the inner layer electrode(s) in the circuit board according to the present embodiment can be suitably determined according to the acceptable range of the curvature of the circuit board in the usage environment and/or intended use of the module containing the circuit board, the configuration and/or arrangement of various electrodes in the circuit board, etc.

As mentioned above, in the circuit board according to the present embodiment, since the difference of the average thermal expansion coefficient of the region in vicinity of the first surface and the thermal expansion coefficient of other regions can be made smaller, the curvature of the circuit board according to the present embodiment can be reduced even when the temperature of the circuit board changes remarkably.

As a result, in the circuit board according to the present embodiment, inconveniences that, due to the curvature of the circuit board, as mentioned above, contact and junction between the circuit board and the high exothermic element may become insufficient, transmission to the circuit board of heat which generates from the high exothermic element may become insufficient, the electrical connection between the high exothermic element and the second electronic circuit may be shut off, and the electrical connection between the circuit elements which constitute the second electronic circuit may be shut off, etc. can be suppressed.

As mentioned above, as concrete measures for making small the difference of the average thermal expansion coefficient of the region in vicinity of the first surface and the average thermal expansion coefficient of other regions in the circuit board according to the present invention for the purpose of suppressing the generation of curvature of the circuit board accompanying a temperature change, it can be exemplified to make the thickness of the conductor which constitutes at least one layer of the inner layer electrode(s) contained in the circuit board according to the second embodiment of the present invention larger than the thickness of the conductor which constitutes the first surface electrode(s).

However, measures other than the above can make small the difference of the average thermal expansion coefficient of the region in vicinity of the first surface and the average thermal expansion coefficient of other regions in the circuit board according to the present invention. For example, the thermal expansion coefficient of the substrate of the circuit board according to the present invention may be configured so that that on the second surface side may become higher than the first surface side. Specifically, for example, the dielectric layer which constitutes the substrate of the circuit board according to the present invention may be formed by plural dielectric layers and it may be configured so that, among these plural dielectric layers, the thermal expansion coefficient of the dielectric layer which forms the second surface that is the surface on the side opposite to the first surface may become larger than the thermal expansion coefficient of the dielectric layer which forms the first surface. Thereby, as mentioned above, even if the volume ratio occupied by the electrode(s) with a large thermal expansion coefficient is relatively large in the region in vicinity of the first surface while that is relatively small in other regions, the difference of the average thermal expansion coefficient of the region in vicinity of the first surface and the average thermal expansion coefficient of other regions can be suppressed to be smaller.

Namely, the fourth embodiment of the present invention is;

the circuit board according to any one of said first embodiment to said third embodiment of the present invention, characterized in that:

said dielectric layer(s) is formed of plural dielectric layers, and among said plural dielectric layers, a dielectric layer forming a second surface which is a surface opposite to said first surface has a thermal expansion coefficient larger than that of a dielectric layer forming said first surface.

As mentioned above, in the circuit board according to the present embodiment, the dielectric layer(s) is formed of plural dielectric layers and it is configured so that, among these plural dielectric layers, a dielectric layer forming a second surface which is a surface opposite to the first surface has a thermal expansion coefficient larger than that of a dielectric layer forming the first surface. Thereby, as mentioned above, even if the volume ratio occupied by the electrode(s) with a large thermal expansion coefficient is relatively large in the region in vicinity of the first surface while that is relatively small in other regions, the difference of the average thermal expansion coefficient between the region in vicinity of the first surface and other regions resulting from such volume ratios of the electrode(s) can be at least partially offset with the difference of the thermal expansion coefficient between the dielectric layers which constitute the substrate of the circuit board. As a result, in the circuit board according to the present embodiment, the difference of the average thermal expansion coefficient of the region in vicinity of the first surface and the average thermal expansion coefficient of other regions can be suppressed to be smaller.

As mentioned above, also in the circuit board according to the present embodiment, since the difference of the average thermal expansion coefficient of the region in vicinity of the first surface and the thermal expansion coefficient of other regions can be made smaller, the curvature of the circuit board according to the present embodiment can be reduced even when the temperature of the circuit board changes remarkably.

As a result, also in the circuit board according to the present embodiment, inconveniences that, due to the curvature of the circuit board, as mentioned above, contact and junction between the circuit board and the high exothermic element may become insufficient, transmission to the circuit board of heat which generates from the high exothermic element may become insufficient, the electrical connection between the high exothermic element and the second electronic circuit may be shut off, and the electrical connection between the circuit elements which constitute the second electronic circuit may be shut off, etc. can be suppressed.

By the way, as mentioned above, the present invention relates to a circuit board for peripheral circuits of high-capacity modules. More particularly, the present invention relates to a circuit board for peripheral circuits to be laminated with a circuit containing a high exothermic element in high-capacity modules including power modules, such as an inverter used in a hybrid car or an electric vehicle, etc. (via the high exothermic element). Furthermore, the present invention also relates to a high-capacity module including a peripheral circuit which uses the circuit board.

Herein, as mentioned above, a high-capacity module refers to a module handling a large electric power, including power modules, such as an inverter, etc. As for such a high-capacity module, as mentioned above, for example, along with the popularization of hybrid cars and of electric vehicles etc., further reduction in size and weight as well as still higher-efficiency has been increasingly strongly demanded.

In order to meet the above-mentioned demand, it is desirable to use the circuit board according to the present invention in a peripheral circuit contained in a high-capacity module. Thereby, in such a high-capacity module, while reduction in size and weight, reduction in surge, and reduction in a loss of the module are achieved, heat which generates from the high exothermic elements, such as a power semiconductor element, can be transmitted more efficiently outside, and reliability as the whole module can be further improved. Therefore, high-capacity modules containing a peripheral circuit using the circuit board according to any one of said first embodiment to said fourth embodiment as well as various other modifications of the present invention is also included in the scope of the present invention.

Namely, the fifth embodiment of the present invention is;

a high-capacity module which comprises a first electronic circuit containing a high exothermic element, and a second electronic circuit laminated through said high exothermic element on the side, on which said high exothermic element is disposed, of said first electronic circuit, characterized in that:

a circuit board used for said second electronic circuit comprises a substrate, which comprises dielectric layer(s) mainly comprising ceramics, and first surface electrode(s), which is formed on the side of said circuit board, facing said first electronic circuit, at least a part of conductor, which constitutes said first surface electrode(s), is embedded inside of said substrate, said conductor, which constitutes said first surface electrode(s), is exposed out of said substrate at least in a region of a first surface which is the surface of said circuit board, facing said first electronic circuit, and said region is opposed to a terminal(s) of said high exothermic element, and the thicknesses of said conductor, which constitutes said first surface electrode(s), is not less than 100 micrometers in a direction perpendicular to said first surface.

Moreover, the sixth embodiment of the present invention is;

a high-capacity module which comprises a first electronic circuit containing a high exothermic element, and a second electronic circuit laminated through said high exothermic element on the side, on which said high exothermic element is disposed, of said first electronic circuit, characterized in that:

a circuit board used for said second electronic circuit comprises a substrate, which comprises dielectric layer(s) mainly comprising ceramics, and first surface electrode(s), which is formed on the side of said circuit board, facing said first electronic circuit, and at least one layer of inner layer electrode(s), which is embedded inside of inner layer(s) of said circuit board, at least a part of conductor, which constitutes said first surface electrode(s), is embedded inside of said substrate, said conductor, which constitutes said first surface electrode(s), is exposed out of said substrate at least in a region of a first surface which is the surface of said circuit board, facing said first electronic circuit, and said region is opposed to a terminal(s) of said high exothermic element, and the thicknesses of said conductor, which constitutes said first surface electrode(s), and conductor, which constitutes at least one layer of said inner layer electrode(s), are not less than 100 micrometers in a direction perpendicular to said first surface.

Furthermore, the seventh embodiment of the present invention is;

the high-capacity module according to said sixth embodiment of the present invention, characterized in that:

the thickness of said conductor, which constitutes at least one layer of said inner layer electrode(s), in a direction perpendicular to said first surface is larger than the thickness of said conductor, which constitutes said first surface electrode(s), in a direction perpendicular to said first surface.

Furthermore, the eighth embodiment of the present invention is;

the high-capacity module according to any one of said fifth embodiment to said seventh embodiment of the present invention, characterized in that:

said dielectric layer(s) is formed of plural dielectric layers, and among said plural dielectric layers, a dielectric layer forming a second surface which is a surface opposite to said first surface has a thermal expansion coefficient larger than that of a dielectric layer forming said first surface.

In the high-capacity module according to any one of said fourth embodiment or said fifth embodiment of the present invention, the second electronic circuit using the circuit board according to any one of said first embodiment or said second embodiment of the present invention, respectively, is laminated through the high exothermic element on the side of the high exothermic element of the first electronic circuit. Thereby, since it becomes possible for heat which generates from the high exothermic element to be released not only via the circuit board of the first electronic circuit, but also via the circuit board of the second electronic circuit, heat dissipation of the whole high-capacity module according to any one of said fourth embodiment or said fifth embodiment of the present invention can be performed effectively, and overheating of the module can be suppressed.

Moreover, as mentioned above, in the circuit board according to said first embodiment or said second embodiment of the present invention, since at least a part of the conductor which constitutes the first surface electrode(s) embedded inside of the substrate, the stress which acts on the interface between the conductor and the substrate (for example, stress which generates due to the difference in the thermal expansion coefficient between the conductor, which constitutes the electrode(s), and the substrate) is relaxed and reduced, and the reliability of the high-capacity module according to any one of said fourth embodiment or said fifth embodiment of the present invention is improved.

Furthermore, as mentioned above, in the circuit board according to any one of said first embodiment or said second embodiment of the present invention, the conductor which constitutes the first surface electrode(s) is exposed out of the substrate at least in the region of the first surface which is the surface of the circuit board, facing the first electronic circuit, and the region is opposed to the terminal(s) of the high exothermic element. Thereby, in the high-capacity module according to any one of said fourth embodiment or said fifth embodiment of the present invention, since the second electronic circuit can be connected with the high exothermic element in a shorter distance, for example, the surge voltage at the time of switching can be suppressed (reduction in surge).

Furthermore, in the circuit board according to any one of said first embodiment or said second embodiment of the present invention, the thicknesses of the conductor, which constitutes the first surface electrode(s), and the conductor, which constitutes at least one layer of the inner layer electrode(s) (included in the circuit board according to said second embodiment of the present invention), are not less than 100 micrometers, more preferably not less than 200 micrometers (in a direction perpendicular to the first surface). Thereby, the loss as the whole high-capacity module according to any one of said fourth embodiment or said fifth embodiment of the present invention can be made smaller.

As mentioned above, in the high-capacity module according to any one of said fifth embodiment to said eighth embodiment of the present invention, heat generating from a high exothermic element, such as a power semiconductor element, can be more efficiently transmitted outside, while attaining reduction in size and weight, reduction in surge, and reduction in a loss. In accordance with such aspects, the high-capacity module according to any one of said fifth embodiment to said eighth embodiment of the present invention can demonstrate high reliability.

By the way, as mentioned above, the above-mentioned high-capacity module refers to a module handling a large electric power, including power modules, such as an inverter, etc. Moreover, when the above-mentioned high-capacity module refers to a power module, the above-mentioned high exothermic element refers to a power semiconductor element, for example, and, more specifically, the above-mentioned high exothermic element refers to a switching element, for example.

Therefore, the ninth embodiment of the present invention is;

the high-capacity module according to any one of said fifth embodiment to said eighth embodiment of the present invention, wherein:

said high-capacity module is a power module.

Moreover, the tenth embodiment of the present invention is;

the high-capacity module according to said ninth embodiment of the present invention, wherein:

said high exothermic element is a switching element.

By the way, in high-capacity modules as mentioned above, for example, reduction of the noise which generates from a power semiconductor element, such as a switching element, has been an important technical subject. Specifically, for example, there is a possibility that abnormalities in switching operation of a switching element may arise due to the noise which generates in accordance with switching operation of a switching element and may destroy a power circuit containing a power semiconductor element, such as a switching element and a peripheral circuit. Furthermore, there is also a possibility that such a noise may leak out of a high-capacity module and affect the operation of the peripheral equipment of the high-capacity module.

In addition, in the art, as a remedy for loss in a power semiconductor element including, for example, IGBT, MOSFET, etc., technology trends, which use a silicon carbide (SiC) wafer or a gallium nitride (GaN) wafer in place of a silicon (Si) wafer used conventionally, are becoming remarkable (for example, SiC-IGBT, SiC-MOSFET, GaN-IGBT, GaN-MOSFET, etc.). In a semiconductor element which uses such a new type of wafer, since operation in higher switching frequency is enabled as compared with a semiconductor element which uses a conventional Si wafer, there is an advantage that miniaturization of a high-capacity module is enabled. However, since the frequency of a noise which generates from these semiconductor elements also rises with the rise of switching frequency, problems resulting from a noise as mentioned above also become more serious. Therefore, in a high-capacity module, reduction of a noise which generates from a power semiconductor element has been an increasingly important technical subject.

As a countermeasure for a noise as mentioned above, it is known that it is effective to connect a capacitor (what is called a "snubber capacitor") in parallel with a power semiconductor. A snubber capacitor has an effect which suppresses voltage change accompanying switching operation of a power semiconductor element. In order to reduce a noise more effectively by such a snubber capacitor, it is necessary to shorten the distance between a power semiconductor element and a snubber capacitor. It is because the longer a wiring (wire) which electrically connects a power semiconductor element with a snubber capacitor becomes, the larger an equivalent inductance of the wiring becomes, and thereby surge voltage induced due to a noise which generates with switching operation increases, and as a result a noise reduction effect by the snubber capacitor is not sufficiently demonstrated.

However, in a conventional high-capacity module, since it is necessary to attach a snubber capacitor to the exterior of a high-capacity module, the wiring (wire) which electrically connects a power semiconductor element with the snubber capacitor becomes long, and a noise reduction effect by the snubber capacitor cannot be sufficiently demonstrated. In addition, in a conventional high-capacity module, a power circuit containing the power semiconductor element and a peripheral circuit which contains the control circuit element for controlling the power semiconductor element, for example, are arranged planarly, and an area for arranging a wiring (wire) for connecting these circuits is required. These have been factors in preventing a high-capacity module from reduction in size and weight. Moreover, problems such as long wiring length due to wire distribution which connects the various circuits which constitute a high-capacity modules as mentioned above and large loss as a whole module, have been also recognized.

Then, it has been proposed to attempt to laminate circuit board of various circuits which constitute a high-capacity module as mentioned above to attain reduction in size and weight of the high-capacity module as well as improve a connection form between the various circuit boards which constitute the high-capacity module to attain reduction in loss of the high-capacity module (refer to PTL 1 to 3). In the art, for a high-capacity module which has such a laminated structure, a configuration where a snubber capacitor is mounted on a circuit board of a peripheral circuit (drive circuit) for controlling a power semiconductor element has been also proposed. Although such a configuration can shorten a wiring (wire) which electrically connects the power semiconductor element with the snubber capacitor, as compared with a configuration where a snubber capacitor is disposed in the exterior of a high-capacity module as previously mentioned, its effect is restrictive and further reduction in surge has been demanded.

Based on the backgrounds as mentioned above, the circuit board according to the present invention may have a capacitor embedded inside of the circuit board in various embodiments including the above-mentioned embodiments. In accordance with such configurations, wiring which electrically connects a power semiconductor element with a snubber capacitor can be further shortened as compared with a circuit board according to a conventional technology. As a result, since the equivalent inductance of the wiring of the wiring decreases, surge voltage induced due to a noise which generates with switching operation decreases. As a result, problems that such a noise may leak out of a high-capacity module and affect the operation of the peripheral equipment of the high-capacity module, etc. can be further reduced.

In addition, when the capacity of a capacitor embedded inside of the circuit board according to the present invention is increased, for example, for the purpose of securing the capacity required for a snubber capacitor, etc., the capacity of the capacitor can be increased by increasing the number of laminations of the conductor (and dielectric inserted between conductors) which constitutes the capacitor. However, in this case, since the thickness of the circuit board, which has a capacitor built-in, increases, there is a possibility that it may become an obstacle to reduction in size and weight of the high-capacity module using the circuit board.

Then, in accordance with the circuit board according to the present invention, in the high-capacity module which has the lamination structure as mentioned above, for the purpose of securing the capacity required for a snubber capacitor without increasing the thickness of the circuit board of a peripheral circuit, an insulating layer which comprises the dielectric having a high dielectric constant can be formed between the conductors which constitute a capacitor and a capacitor can be formed by using the insulating layer. In accordance with such a configuration, it becomes easy to secure the capacity required for a capacitor without increasing the number of laminations of the conductor (and dielectric inserted between conductors) which constitutes the capacitor embedded inside of the circuit board according to the present invention (that is, without increasing the thickness of the circuit board).

However, since the thermal conductivity of material which has a high dielectric constant is generally low, the thermal conductivity as the whole circuit board, inside of which an insulating layer comprising a dielectric having a high dielectric constant is formed, may decrease and, as a result, it may become difficult to utilize the circuit board as a heat dissipation pathway which transmits efficiently outside the heat which generates from a high exothermic element, such as a power semiconductor element. In such a case, not by form an insulating layer which comprises a dielectric having a high dielectric constant so that it may cover the whole of a plane parallel to a principal surface of a circuit board, but by partially arranging the insulating layer in a plane parallel to the principal surface of a circuit board to leave a region where the insulating layer is not arranged in the plane, a heat conduction pathway for releasing out heat which generates from a high exothermic element through the circuit board can be secured.

Moreover, as mentioned above, in order to fully demonstrate the noise reduction effect by a snubber capacitor, it is desirable to shorten wiring which electrically connects a power semiconductor element with a snubber capacitor. Therefore, also in the circuit board according to the embodiment which has a configuration in which a capacitor is embedded inside of a circuit board as mentioned above, it is desirable to arrange a capacitor in a position which becomes close to a high exothermic element, such as a power semiconductor element, at the time of lamination with the first circuit board (circuit board used for the first electronic circuit). For example, in the second circuit board for which the circuit board according to the present invention is used, a capacitor can be embedded in the layer nearest to the first surface that is a principal surface on the side which is opposed to a high exothermic element at the time of lamination with the first circuit board.

In addition, in the layer nearest to the first surface in the second circuit board (circuit board used for the second electronic circuit) for which the circuit board according to the present invention is used, electrode(s) for attaining an electrical connection with the first electronic circuit containing a high exothermic element (first surface electrode(s)) is disposed. Therefore, in this case, a capacitor will be embedded in the same layer as the first surface electrode(s). Thereby, in such an embodiment, since wiring which electrically connects the capacitor embedded inside of the second circuit board with the high exothermic element can be shortened, noise reduction effect by the capacitor can be fully demonstrated. In addition, since the conductor which constitutes the first surface electrode(s) is also embedded in the layer in which the capacitor is embedded, even in a case where an insulating layer which comprises a dielectric having a high dielectric constant is formed between the conductors which constitute the capacitor as mentioned above, since the conductor which constitutes the first surface electrode(s) can be used as a heat dissipation pathway which transmits efficiently outside the heat which generates from the high exothermic element, such as a power semiconductor element, decrease in heat dissipation efficiency in the high-capacity module using the circuit board as the second circuit board can be suppressed.

In accordance with these embodiments, in high-capacity modules including a power module, such as an inverter, which are equipped with a high exothermic element, such as a power semiconductor element including a switching element, for example, heat which generates from the high exothermic element can be transmitted outside more efficiently to further improve the reliability of the high-capacity module, while attaining reduction in size and weight, reduction in surge, and reduction in a loss.

Hereafter, referring to accompanying drawings etc., configurations of circuit boards according to some embodiments of the present invention, etc. will be explained. However, the explanation which will be described below is provided only for the purpose of exemplification, and the scope of the present invention should not be interpreted as to be limited to the following explanation.

Example

1. Configurations of a Circuit Board According to an Embodiment of the Present Invention and a Module Containing the Circuit Board As mentioned above, FIG. 1 is a schematic view showing the configurations of a circuit board according to one embodiment of the present invention and a module containing the circuit board. As shown in FIG. 1, a module 100 which contains a circuit board according to one embodiment of the present invention comprises a power circuit (first electronic circuit 110) containing a power semiconductor element 113

(for example, IGBT etc.) and a drive circuit (second electronic circuit 120) containing a circuit board 121 according to one embodiment of the present invention.

The first electronic circuit 110 comprises the power semiconductor element 113 disposed through a pad for adhesion 112 on a circuit board 111 of the first electronic circuit, and is disposed in a case 114 formed so as to surround the side face and bottom face of the first electronic circuit 110, and is joined to a heat sink 115 through the bottom portion of the case 114. Therefore, heat which generates from the power semiconductor element 113 is transmitted, through the pad for adhesion 112, the ceramic circuit board 111, and the case 114, to the heat sink 115, and is released.

On the other hand, the second electronic circuit 120 comprises various circuit elements such as a control circuit element 125 (for example, a gate drive IC etc.) and a snubber capacitor 126 disposed on the circuit board 121 according to the present embodiment. Second surface electrodes 124 are formed as lands on the surface on the side where these circuit elements are disposed, and these circuit elements are connected through the lands. On the other hand, on the surface (first surface) on the side opposite to the second surface of the circuit board 121 according to the present embodiment, first surface electrodes 122 for attaining an electrical connection with the power semiconductor element 113 on the first electronic circuit are formed. Furthermore, at least one layer of inner layer electrodes 123 is embedded inside of an inner layer portion of the circuit board 121 according to the present embodiment.

As mentioned above, as for the first surface electrodes 122, at least a part of conductor which constitutes the electrodes is embedded inside of the substrate of the circuit board 121, and at least in a region of the first surface, which is opposed to a terminal(s) of the power semiconductor element 123, the conductor which constitutes the first surface electrodes 122 is exposed out of the substrate. Moreover, the thicknesses of the conductor which constitutes the first surface electrodes 122 and the conductor which constitutes at least one layer of the inner layer electrodes 123 are not less than 100 micrometers.

Such second electronic circuit 120 is laminated through the power semiconductor element 113 on the side on which the power semiconductor element 113 of the first electronic circuit 110 is disposed, and the first surface electrode 122 and the terminals of the power semiconductor element 113 are electrically connected, for example, by means of soldering, etc. Thereby, heat which generates from the power semiconductor element 113 is transmitted not only through the circuit board 111 of the first electronic circuit 110 to the heat sink 115 as mentioned above, but also through, at least, the first surface electrode 122 to the ceramic circuit board 121 of the second electronic circuit 120, and therefore is released more effectively.

In addition, in the present embodiment, the whole conductor, which constitutes the first surface electrodes 122, is embedded inside of the substrate and only the surface of the conductor is exposed in the same plane as the first surface of the ceramic circuit board 111 of the second electronic circuit 120. Therefore, both of surfaces of the substrate of the ceramic circuit board 121 of the second electronic circuit 120 and the conductor, which constitutes the first surface electrodes 122, contact the power semiconductor element 113 simultaneously.

Thereby, heat which generates from the power semiconductor element 113 is transmitted, from the portion which directly contacts the conductor of the first surface electrodes 122 (for example, terminal part of the power semiconductor element 113, etc.) to the conductor, and from the portion in contact with the substrate of the circuit board 121 of the second electronic circuit 120 to the substrate, respectively. Therefore, in the power module 100 using the circuit board 121 according to the present embodiment, the heat which generates from the power semiconductor element 113 is released still more effectively, and overheating of the module is suppressed still more effectively.

Therefore, in the power module 100 using the circuit board 121 according to the present embodiment, problems, such as breakage of the module by the excessive rise in temperature resulting from the heat which generates from the power semiconductor element 113 (for example, degradation of sealing resin of a circuit element which constitutes the module, and expansion or deformation of the resin board of a peripheral circuit) etc. are reduced.

Moreover, in the power module using the circuit board 121 according to the present embodiment, at least a part of the conductor which constitutes the first surface electrodes 122 is embedded inside of the substrate of the circuit 121. Thereby, since the stress which acts on the interface between the conductor and the substrate (for example, stress which generates due to the difference in the thermal expansion coefficient between the conductor which constitutes the first surface electrodes 122 and the substrate, stress which generates due to the difference in the thermal expansion coefficient between the circuit board 121 according to the present embodiment and the power semiconductor element 113 and/or the circuit board 111 of the first electronic circuit 110, etc.) can be reduced, a highly reliable high-capacity module can be achieved.

Furthermore, in circuit board 121 according to the present embodiment, the conductor which constitutes the first surface electrodes 122 is exposed out of the substrate at least in the region of a first surface which is the surface of the circuit board, facing the first electronic circuit 110, and the region is opposed to a terminal(s) of the power semiconductor element 113. Thereby, the second electronic circuit 120 which contains the circuit board 121 according to the present embodiment and the power semiconductor element 113 can be connected in a shorter distance and, for example, the surge voltage at the time of switching can be suppressed (reduction in surge).

Furthermore, as mentioned above, the thicknesses (in a direction which intersects perpendicularly with the first surface) of the conductor which constitutes the first surface electrodes 122 and the conductor which constitutes at least one layer of the inner layer electrodes 123 are not less than 100 micrometers. Thereby, the loss as the whole module 100 including the second electronic circuit 120 that uses the circuit board 121 according to the present embodiment can be made smaller.

As mentioned above, in accordance with the present embodiment, in high-capacity modules including power modules, such as an inverter, while attaining reduction in size and weight, reduction in surge, and reduction in a loss, a highly reliable circuit board for peripheral circuits which can transmit more efficiently outside heat which generates from a high exothermic element, such as a power semiconductor element, can be provided.

2. Configuration of a High-Capacity Module According to a Conventional Technology On the other hand, configuration of a power module according to a conventional technology will be explained briefly, referring to FIG. 2. As mentioned above, FIG. 2 is a schematic view showing the configurations of a power module according to a conventional technology.

Figure 2:
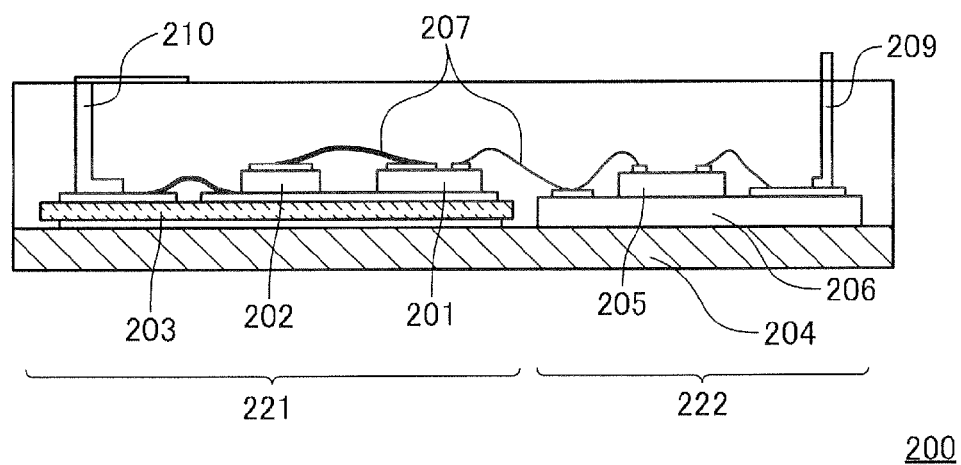
FIG. 2 A schematic view showing the configurations of a power module according to a conventional technology.

As shown in FIG. 2, in a power module 200 according to a conventional technology, on a metal base 204, a power circuit 221 containing a switching element (IGBT 201) and a drive circuit 222 containing a control circuit element which controls IGBT 201 are arranged planarly, and these circuits are connected by aluminum wires 207. Therefore, in the power module 200 according to a conventional technology, in addition to the area for arranging these circuits planarly, the area for the wiring which connects these circuits is also required, and therefore reduction size and weight of the module 200 is difficult.

Moreover, in the power module 200 according to a conventional technology, since wiring length becomes longer due to the wiring of the aluminum wires 207 for connecting the power circuit 221 and the drive circuit 222, there is a concern about problems that the loss as the whole module 200 becomes larger, and the surge voltage which generates on switching due to the equivalent inductance of the aluminum wires 207 becomes larger, etc.

Figure 3:
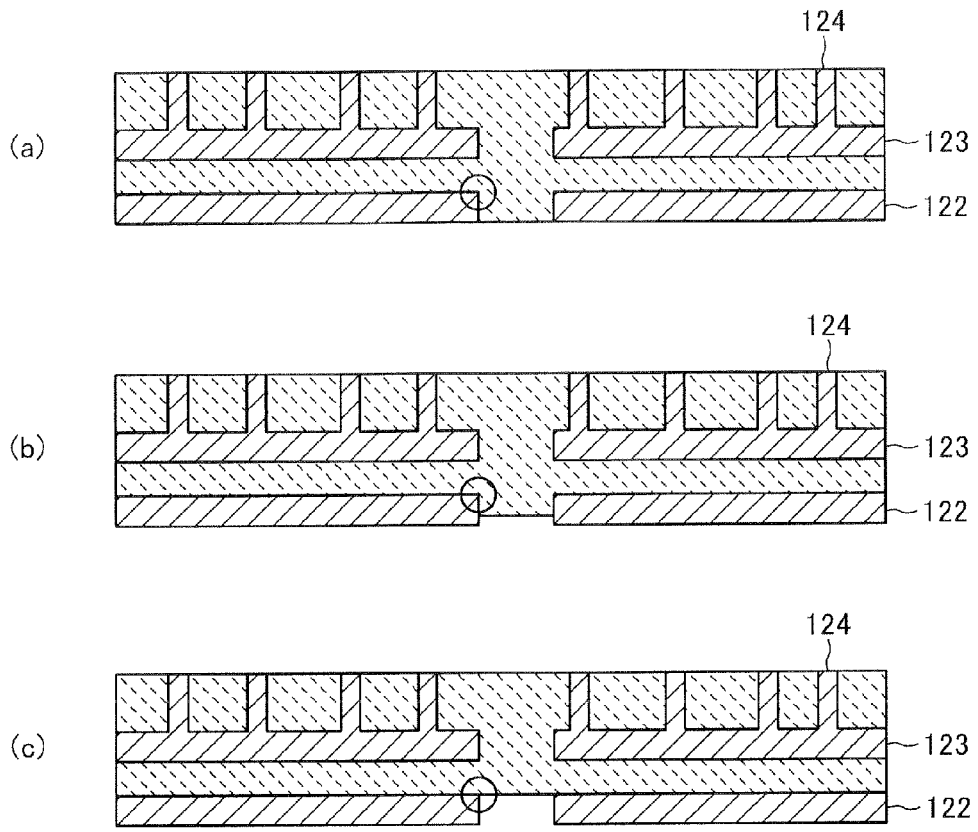
FIG. 3 A schematic view illustrating the difference in stresses acting on the interface between electrode(s) disposed at the surface of the circuit board and the substrate of circuit boards according to one embodiment of the present invention and a circuit board according to a conventional technology.

On the other hand, in the circuit board according to the present invention and the high-capacity module using the circuit board, as mentioned above, in addition to the above-mentioned problems concerned in the power module according to a conventional technology, the problem of the heat dissipation accompanying the miniaturization of the module by lamination of the various circuits which constitute a high-capacity module can be also solved,

3. Reliability of a Circuit Board According to an Embodiment of the Present Invention Next, reliability of a circuit board according to an embodiment of the present invention will be explained below, referring to FIG. 3. As mentioned above, FIG. 3 is a schematic view illustrating the difference in stresses acting on the interface between electrode(s) disposed at the surface of the circuit board and the substrate of circuit boards according to one embodiment of the present invention and a circuit board according to a conventional technology. In FIG. 3, (a) and (b) represent circuit boards according to embodiments of the present invention, and (c) represents a circuit board according to a comparative example.

First, in the circuit board according to one embodiment of the present invention shown in (a), first surface electrodes 122 for attaining an electrical connection with a high exothermic element (not shown) disposed in the first electronic circuit (not shown) is completely embedded into the substrate of the circuit board, and only the surface thereof is exposed in the first surface (the lower surface in FIG. 3) of the circuit board. Moreover, inner layer electrodes 123 are embedded inside of the inner layer of the circuit board. Furthermore, second surface electrodes 124 for attaining an electrical connection with various circuit elements and terminals which constitute the second electronic circuit are embedded at the second surface side (the upper side in FIG. 3) of the circuit board, and the surface thereof is exposed out of the second surface, and constitutes lands etc.

In the circuit board according to the present embodiment, the exposed surfaces of the first surface electrodes 122 and the first surface of the circuit board are in the same plane. Therefore, since a high exothermic element will also contact the substrate portion of the circuit board as a result when the first surface electrodes 122 of the circuit board are jointed with the high exothermic element of the first electronic circuit, the heat which generates from the high exothermic element is not only released through the circuit board of the first electronic circuit (not shown), but also transmitted to the first surface electrodes and substrate of the circuit board to be released from the second surface (the upper surface in FIG. 3) of the circuit board. Therefore, in the present embodiment, more efficient heat dissipation can be attained.

By the way, in a circuit board provided with electrode(s) like the circuit board according to the present embodiment, as mentioned above, it is assumed that stress which generates due to the difference in a thermal expansion coefficient between the conductor, which constitute the first surface electrode(s), and the substrate, and stress which generates due to the difference in a thermal expansion coefficient between the circuit board and a high exothermic element and/or the circuit board of the first electronic circuit, etc. may act on the interface between the conductor and the substrate. In this case, as shown by the circle mark in FIG. 3, the stress may concentrate on the end portion of the interface between the conductor and the substrate (corner portion of the conductor which constitutes an electrode), etc. In this case, depending on the magnitude of the stress, for example, there is a possibility that the conductor which constitutes the first surface electrodes may be separated from the circuit board and it may lead to the fall of the reliability of the whole module and may lead to disconnection and destruction of a circuit at worst.

However, in the circuit board according to the present embodiment, since the conductor which constitutes the first surface electrode(s) is embedded inside of the substrate, for example, unlike a case where a leadframe or a conductive pattern is pasted on the surface of a circuit board, the surroundings of the portion, on which stress as mentioned above concentrates, is covered with the substrate of the circuit board. Thereby, since the stress is relaxed and distributed, problems as mentioned above are unlikely to occur, and the reliability as the whole module including the electronic circuit which uses the circuit board can be further improved.

Next, in the circuit board according to another embodiment of the present invention shown in (b), the first surface electrodes 122 are partially embedded into the substrate of the circuit board and portions other than the embedded portions are exposed at the first surface of the circuit board. Namely, in the circuit board according to the present embodiment, a part of the first surface electrodes partially protrudes from the first surface. In addition, in the circuit board according to the present embodiment, the inner layer electrodes 123 are embedded inside of the inner layer of the circuit board, and the second surface electrodes 124 are embedded in the second surface side of the circuit board, similarly to the embodiment of the present invention shown in the above-mentioned (a).

In the circuit board according to the present embodiment, the exposed surfaces of the first surface electrodes 122 (faces which are opposed to the high exothermic element of the first electronic circuit) and the first surface of the circuit board are not in the same plane. Therefore, when first surface electrodes 122 of the circuit board are joined to the high exothermic element of the first electronic circuit, although the high exothermic element does not contact the substrate portion of the circuit board, the heat which generates from the high exothermic element is not only released through the circuit board of the first electronic circuit (not shown), but also transmitted to the circuit board through the first surface electrodes, and is released from the second surface (the upper face in FIG. 3) of the circuit board.

Moreover, also in the circuit board according to the present embodiment, since the conductor which constitutes the first surface electrode(s) is embedded inside of the substrate, although being embedded partially, similarly to the embodiment of the present invention shown in the above-mentioned (a), for example, the surroundings of the portion, on which stress which generates due to the difference in a thermal expansion coefficient between the conductor, which constitute the first surface electrode(s), and the substrate, or stress which generates due to the difference in a thermal expansion coefficient between the circuit board and a high exothermic element and/or the circuit board of the first electronic circuit, etc. concentrates (shown by the arrow in FIG. 3), is covered with the substrate of the circuit board. Thereby, since the stress is relaxed and distributed also in the circuit board according to the present embodiment, as mentioned above, problems that the conductor which constitutes the first surface electrodes is separated from the circuit board, the reliability of the whole module decreases, or the circuit is disconnected or destroyed are suppressed, and the reliability as the whole module including the electronic circuit which uses the circuit board is improved.

On the other hand, in the circuit board according to the comparative example shown in (c), the first surface electrodes 122 are not embedded inside of the substrate of the circuit board, but the first surface electrodes 122 are stuck on the first surface of the circuit board. In addition, in the circuit board according to the present comparative example, the inner layer electrodes 123 are embedded inside of the inner layer of the circuit board, and the second surface electrodes 124 are embedded in the second surface side of the circuit board, similarly to the embodiments of the present invention shown in the above-mentioned (a) and (b).

In the circuit board according to the present comparative example, as mentioned above, the first surface electrodes 122 are stuck on the first surface of the circuit board. Therefore, unlike the embodiments of the present invention shown in the above-mentioned (a) and (b), for example, the surroundings of the portion, on which stress which generates due to the difference in a thermal expansion coefficient between the conductor, which constitute the first surface electrode(s), and the substrate, and/tress which generates due to the difference in a thermal expansion coefficient between the circuit board and a high exothermic element and/or the circuit board of the first electronic circuit, etc. concentrates (shown by the circle in FIG. 3), is not covered with the substrate of the circuit board. As a result, in the circuit board according to the present comparative example, the stress is not relaxed or distributed, and there is a higher possibility that the conductor which constitutes the first surface electrodes may be separated from the circuit board, the reliability of the whole module including the circuit may decrease, and/or the circuit may be disconnected or destroyed, as mentioned above, than in the circuit board according to the present invention, and the reliability as the whole module including the electronic circuit which uses the circuit board is concerned.

Figure 4:
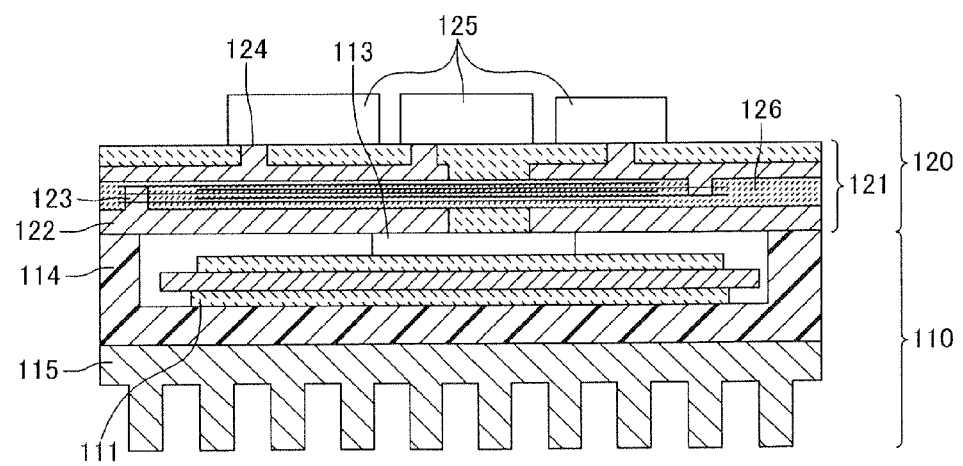
FIG. 4 A schematic view showing the configurations of a circuit board according to one modification of an embodiment of the present invention, wherein a capacitor is embedded inside of a second electronic circuit board, and a module containing the circuit board.

4. Configurations of a Circuit Board According to a Modification of the Present Invention and a Module Containing the Circuit Board As mentioned above, FIG. 4 is a schematic view showing the configurations of a circuit board according to one modification of an embodiment of the present invention, wherein a capacitor is embedded inside of a second electronic circuit board, and a module containing the circuit board. As shown in FIG. 4, in the high-capacity module 100 according to the present modification, the snubber capacitor 126 is embedded inside of the second circuit board 121. By such a configuration, wiring which electrically connects the power semiconductor element 113 and the snubber capacitor 126 can be further shortened as compared with the circuit board according to a conventional technology as mentioned above. As a result, since the equivalent inductance which the wiring has becomes smaller, the surge voltage induced due to the noise which generates from the power semiconductor element 113 decreases. As a result, problems that such a noise breaks the power circuit (first electronic circuit 110) and/or the peripheral circuit (second electronic circuit), and/or affects the operation of the peripheral equipment of the high-capacity module 100 can be further reduced.

In addition, in the case where the capacity of the capacitor 126 embedded inside of the circuit board (the second circuit board 121) according to the present modification is increased, for example, for the purpose of securing the capacity required for the snubber capacitor 126, etc., the capacity of the capacitor 126 can be increased by increasing the number of laminations of the conductor (and dielectric inserted between the conductors) which constitutes the capacitor 126, as mentioned above. However, in this case, since the thickness of the second circuit board 121, which has the capacitor 126 built-in, increases, it becomes an obstacle to reduction in size and weight of the high-capacity module 100.

Then, in the circuit board (the second circuit board 121) according to the present modification, in the high-capacity module 100, for the purpose of securing the capacity required for the snubber capacitor 126 without increasing the thickness of the second circuit board 121, by forming an insulating layer which comprises dielectric having a high dielectric constant between the conductors which constitute the capacitor 126, the capacitor 126 using the insulating layer can be formed. In accordance with such a configuration, it becomes easy to secure the capacity required for the capacitor 126 without increasing the number of laminations of the conductor (and dielectric inserted between the conductors) which constitutes the capacitor 126 embedded inside of the second circuit board 121 (that is, without increasing the thickness of the second circuit board 121).

Figure 5:
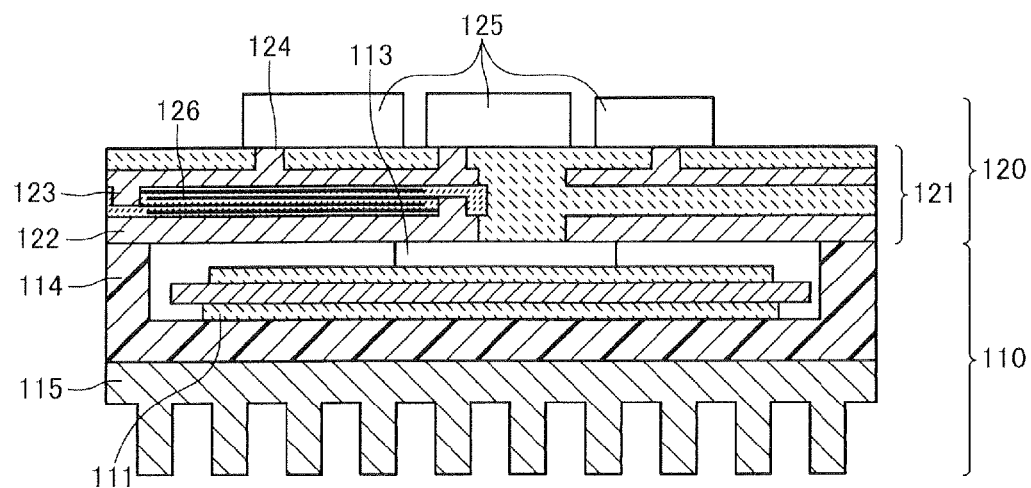
FIG. 5 A schematic view showing the configurations of a circuit board according to another modification of an embodiment of the present invention, wherein a capacitor is embedded in a part of region(s) inside of a second electronic circuit board, and a module containing the circuit board.

5. Configurations of a Circuit Board According to a Modification of the Present Invention and a Module Containing the Circuit Board As mentioned above, FIG. 5 is a schematic view showing the configurations of a circuit board according to another modification of an embodiment of the present invention, wherein a capacitor is embedded in a part of region(s) inside of a second electronic circuit board, and a module containing the circuit board. As shown in FIG. 5, in the high-capacity module 100 according to the present modification, the capacitor 126 is not formed so that it may cover the whole of a plane parallel to a principal surface of the second circuit board 121, but it is partially arranged in a plane parallel to the principal surface of the second circuit board 121. By such a configuration, in the high-capacity module 100 according to the present modification, even when an insulating layer which comprises dielectric having a high dielectric constant (that is, material which has low thermal conductivity) is to be formed between the conductors which constitute the capacitor 126 to increase the capacity of the capacitor 126 as mentioned above, a region where the insulating layer is not arranged (disposed) is left in a plane parallel to the principal surface of the second circuit board 121. As a result, a heat conduction pathway for releasing out heat which generates from the high exothermic element 113 through the second circuit board 121 can be secured.

Figure 6:
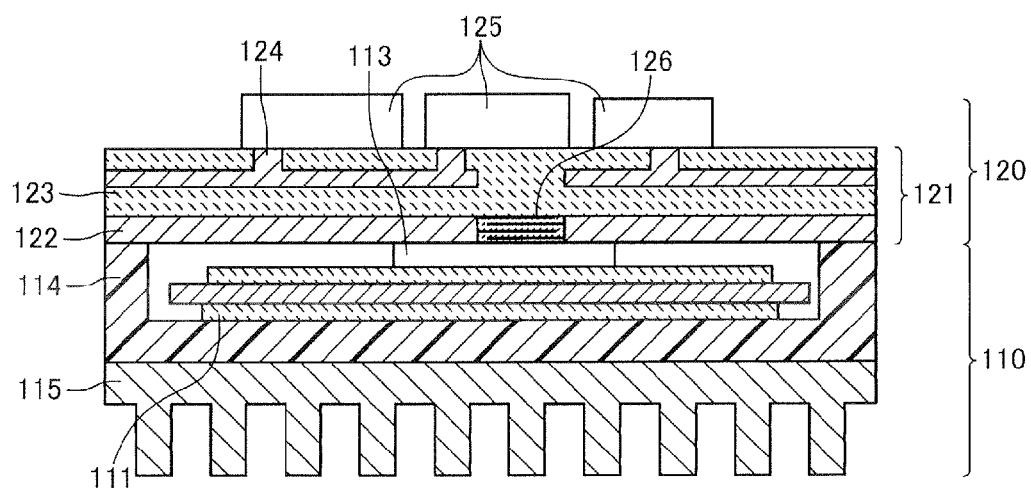
FIG. 6 A schematic view showing the configurations of a circuit board according to still another modification of an embodiment of the present invention, wherein a capacitor is embedded within the layer nearest to the first surface inside of a second electronic circuit board, and a module containing the circuit board.

6. Configurations of a Circuit Board According to a Modification of the Present Invention and a Module Containing the Circuit Board As mentioned above, FIG. 6 is a schematic view showing the configurations of a circuit board according to still another modification of an embodiment of the present invention, wherein a capacitor is embedded within the layer nearest to the first surface inside of a second electronic circuit board, and a module containing the circuit board. As shown in FIG. 6, in the high-capacity module 100 according to the present modification, the capacitor 126 is embedded in the layer nearest to the first surface that is a principal surface on the side which is opposed to the high exothermic element 113 at the time of lamination with the first circuit board 111, among the dielectric layers which constitute the second circuit board 121. By such a configuration, in the high-capacity module 100 according to the present modification, since wiring which electrically connects the capacitor 126 embedded inside of the second circuit board 121 and the high exothermic element 113 can be shortened, noise reduction effect by the capacitor 126 can be fully demonstrated.

Moreover, in the second circuit board 121 according to the present modification, similarly to the circuit boards according to other embodiments of the present invention, the first surface electrodes 122 for attaining an electrical connection with the first electronic circuit 110 containing the high exothermic element 113 is disposed on the first surface. Namely, in the second circuit board 121 according to the present modification, the capacitor 126 is embedded in the same layer as the first surface electrodes 122. Thus, since the conductor which constitutes the first surface electrodes 122 is also embedded in the layer in which the capacitor 126 is embedded, even when an insulating layer which comprises the dielectric having a high dielectric constant is formed between the conductors which constitute the capacitor 126 as mentioned above, the conductor which constitutes the first surface electrode 122 can be used as a heat dissipation pathway which transmits efficiently outside the heat which generates from the high exothermic element 113, such as a power semiconductor element. As a result, also in the high-capacity module 100 according to the present modification, decline in heat dissipation efficiency can be suppressed.

As mentioned above, the circuit board according to the present invention is quite useful as a reliable circuit board for peripheral circuits, which can transmit more efficiently outside the heat generated from highly exothermic elements, such as a power semiconductor element, while attaining reduction in size and weight, reduction in surge, and reduction in a loss, in high-capacity modules including power modules, such as an inverter. Therefore, the high-capacity module including the peripheral circuit using the circuit board according to the present invention can achieve high reliability by attaining higher heat dissipation efficiency, while attaining reduction in size and weight, reduction in surge, and reduction in a loss.

Although some embodiments with specific configurations have been explained above for the purpose of explaining the present invention, it is needless to say that the scope of the present invention is not limited to these exemplary embodiments and various modifications can be properly added thereto within the limits of the matter described in the claims and specification.

REFERENCE SIGNS LIST

100: power module, 110: first electronic circuit, 111: circuit board of the first electronic circuit, 112: pad for adhesion, 113: power semiconductor element, 114: case, 115: heat sink, 120: second electronic circuit, 121: circuit board of the second electronic circuit, 122: first surface electrode, 123: inside layer electrode, 124: second surface electrode, 125: control circuit element, 126: snubber capacitor, 200: power module, 201: IGBT, 202: diode, 203: ceramic circuit board, 204: metal base, 205: gate drive IC, 206: control circuit board, 207: aluminum wire, 209: control signal terminal, 210: power input/output terminal, 221: power circuit, and 222: drive circuit.

The invention claimed is:

1. A circuit board for a second electronic circuit that is laminated on a side of a first electronic circuit on which a high exothermic element is disposed wherein:
   said circuit board comprises a substrate, which comprises at least one dielectric layer mainly comprising ceramics, and at least one first surface electrode formed on a first side of said circuit board that faces said first electronic circuit,
   at least a part of said first surface electrode is embedded inside of said substrate,
   a remaining part of said first surface electrode is exposed outside of said circuit board for said second electronic circuit and defines a major portion of said first side of said substrate that faces said first electronic circuit such that a portion of a first surface of said first surface electrode is opposed to at least one terminal of said high exothermic element, and
   the thickness of said first surface electrode is not less than 100 micrometers in a direction perpendicular to said first surface.

2. The circuit board according to claim 1, wherein:
   said dielectric layer is formed of a plurality of dielectric layers and a dielectric layer forming a second surface which is a surface opposite to said first surface has a thermal expansion coefficient larger than that of a dielectric layer forming said first surface.

3. A circuit board for a second electronic circuit that is laminated on a side of a first electronic circuit on which a high exothermic element is disposed wherein:
   said circuit board comprises a substrate, which comprises at least one dielectric layer mainly comprising ceramics, at least one first surface electrode formed on a first side of said circuit board that faces said first electronic circuit, and at least one inner layer electrode, which is embedded inside of the dielectric layer of said circuit board,
   at least a part of said first surface electrode is embedded inside of said substrate,
   a remaining part of said first surface electrode is exposed outside of said circuit board for said second electronic circuit and defines a major portion of said first side of said substrate that faces said first electronic circuit such that a portion of a first surface of said first surface electrode is opposed to at least one terminal of said high exothermic element, and
   the thicknesses of said first surface electrode and said inner layer electrode are not less than 100 micrometers in a direction perpendicular to said first surface.

4. The circuit board according to claim 3, wherein:
   the thickness of said inner layer electrode in a direction perpendicular to said first surface is larger than the thickness of said first surface electrode in a direction perpendicular to said first surface.

5. The circuit board according to claim 4, wherein:
   said dielectric layer is formed of a plurality of dielectric layers and a dielectric layer forming a second surface which is a surface opposite to said first surface has a thermal expansion coefficient larger than that of a dielectric layer forming said first surface.

6. The circuit board according to claim 3, wherein:
said dielectric layer is formed of a plurality of dielectric layers and a dielectric layer forming a second surface which is a surface opposite to said first surface has a thermal expansion coefficient larger than that of a dielectric layer forming said first surface.

7. A high-capacity module which comprises a first electronic circuit containing a high exothermic element, and a second electronic circuit laminated through said high exothermic element on the side, on which said high exothermic element is disposed, of said first electronic circuit, wherein:
a circuit board for said second electronic circuit comprises a substrate, which comprises at least one dielectric layer mainly comprising ceramics, and at least one first surface electrode formed on a first side of said circuit board that faces said first electronic circuit,
at least a part of said first surface electrode is embedded inside of said substrate,
a remaining part of said first surface electrode is exposed outside of said circuit board for said second electronic circuit and defines a major portion of said first side of said substrate that faces said first electronic circuit such that a portion of a first surface of said first surface electrode is opposed to at least one terminal of said high exothermic element, and
the thicknesses of said first surface electrode is not less than 100 micrometers in a direction perpendicular to said first surface.

8. The high-capacity module according to claim 7, wherein:
said dielectric layer is formed of a plurality of dielectric layers and a dielectric layer forming a second surface which is a surface opposite to said first surface has a thermal expansion coefficient larger than that of a dielectric layer forming said first surface.

9. A high-capacity module which comprises a first electronic circuit containing a high exothermic element, and a second electronic circuit laminated through said high exothermic element on the side, on which said high exothermic element is disposed, of said first electronic circuit, wherein:
a circuit board for said second electronic circuit comprises a substrate, which comprises at least one dielectric layer mainly comprising ceramics, and at least one first surface electrode formed on a first side of said circuit board that faces said first electronic circuit, and at least one inner layer electrode which is embedded inside of inner layer(s) of said circuit board,
at least a part of said first surface electrode is embedded inside of said substrate,
a remaining part of said first surface electrode is exposed outside of said circuit board for said second electronic circuit and defines a major portion of said first side of said substrate that faces said first electronic circuit such that a portion of a first surface of said first surface electrode is opposed to at least one terminal of said high exothermic element, and
the thicknesses of said first surface electrode and said inner layer electrode is not less than 100 micrometers in a direction perpendicular to said first surface.

10. The high-capacity module according to claim 9, wherein:
the thickness of said inner layer electrode in a direction perpendicular to said first surface is larger than the thickness of said first surface electrode in a direction perpendicular to said first surface.

11. The high-capacity module according to claim 10, wherein:
said dielectric layer is formed of a plurality of dielectric layers and a dielectric layer forming a second surface which is a surface opposite to said first surface has a thermal expansion coefficient larger than that of a dielectric layer forming said first surface.

12. The high-capacity module according to claim 9, wherein:
said dielectric layer is formed of a plurality of dielectric layers and a dielectric layer forming a second surface which is a surface opposite to said first surface has a thermal expansion coefficient larger than that of a dielectric layer forming said first surface.

* * * * *